United States Patent [19]
Lewandowski

[11] Patent Number: 5,291,073
[45] Date of Patent: Mar. 1, 1994

[54] THERMAL POWER SENSOR

[75] Inventor: Robert J. Lewandowski, King County, Wash.

[73] Assignee: John Fluke Mfg. Co., Inc., Everett, Wash.

[21] Appl. No.: 957,935

[22] Filed: Oct. 7, 1992

[51] Int. Cl.$^5$ .......................... H03K 3/26; H03K 5/22
[52] U.S. Cl. .................... 307/310; 307/355; 324/95; 324/98; 324/99 R; 324/106
[58] Field of Search .................. 307/310, 355; 324/95, 324/98, 99 R, 106

[56] References Cited
U.S. PATENT DOCUMENTS

5,189,362  2/1993  Doble ................................. 324/106

Primary Examiner—Margaret R. Wambach
Attorney, Agent, or Firm—Seed and Berry

[57] ABSTRACT

A thermal power sensor for providing an output signal that is linearly related to the amount of power derived from a power source over a first range and that is square law related to the amount of power derived from a power source over a second range which may overlap the first range. The apparatus comprises a pair of matched transistors connected in a common emitter configuration. Each of the matched transistors is thermally coupled to a matched resistor so that heat generated in the resistor is transmitted to its respective transistor to cause temperature variations therein. The current through each transistor is a function of the temperature of the transistor. The matched transistors are connected in series with a pair of cascode transistors. The cascode transistors are connected to a first differential amplifier which senses and amplifies the differential voltage which results from any difference in current flow through the matched transistors. The output of the first differential amplifier is connected to the bases of the cascode transistors to vary the bias voltage applied to the matched transistors. A second differential amplifier is connected to the differential output of the first differential amplifier and has its output connected to the second matched resistor. The effect of the feedback loop which includes the first differential amplifier, the cascode transistor and the matched transistors is to maintain the current flow through the matched transistors constant, whereby their collector-emitter voltage is linearly proportional to the power being sensed. The effect of the second loop, including the second differential amplifier and the second matched resistor, is to maintain thermal equilibrium and equality between the matched transistors and their associated resistors to provide a square law indication of the power being sensed. A combined indicator is provided for providing an indication of sensed power over the first and second ranges.

23 Claims, 2 Drawing Sheets

THERMAL POWER SENSOR

TECHNICAL FIELD

This invention is directed to thermal power sensing devices and RMS voltage converters, particularly to devices for sensing alternating voltage signals and RF or microwave power.

BACKGROUND OF THE INVENTION

Thermal sensors have long been used to measure power, particularly at RF and microwave frequencies. One type of conventional thermal sensor uses a pair of power-dissipating elements, such as resistors, with a related pair of temperature-sensitive elements thermally coupled to the power-dissipating elements. The input signal to be measured is applied to the first resistor, thereby causing it to couple thermal energy to the first temperature-sensitive element in accordance with the power of the input signal. The temperature-sensitive elements may be such semiconductor devices as junction diodes or bipolar transistors.

The signals from the first and second temperature-sensitive elements are each fed to an input of a differential amplifier which produces a DC output signal. This DC signal is fed to the second resistor and is caused to dissipate a power that equals the power dissipated by the input signal in the first resistor. When balance is achieved, the DC voltage developed across the second resistor by the differential amplifier is equivalent to the RMS or effective value of the input signal which causes the temperature rise in the first resistor. One implementation of this technique is shown in U.S. Pat. No. 3,668,428, issued to Henry Koerner. Attention is also directed to U.S. Pat. No. 4,023,099, issued to van Kessel, and to U.S. Pat. No. 4,257,061, issued to Chapel.

While this arrangement can have good sensitivity and works well at full-scale or high levels, it suffers several significant limitations inherent in its design. As an example, at low signal or power levels, there are several error effects that limit performance and reduce the useful range of the device. At very low input signal levels, noise in the temperature-sensitive elements is amplified by the necessarily large forward gain of the differential amplifier. The output noise from the differential amplifier is dissipated in the second resistor. The amplified noise power is an offsetting signal that degrades the linearity of the power sensor for low input signal levels. The noise also establishes a floor which the input signal must exceed in order to be detected. The noise thus limits the dynamic range of the power sensor. Other problems with these prior art thermal power sensors also exist, as described in greater detail below.

SUMMARY OF THE INVENTION

It is an object of the present invention to provide an improved sensor for generating an output signal that is linearly related to the magnitude of a signal over a wide dynamic range.

It is a further object of the invention to provide an improved thermal sensor which has acceptable sensitivity at both high and low levels.

It is a further object of the invention to provide a thermal sensor that has an extremely accurate response to the magnitude of an applied signal.

These and other objects of the invention are provided by a preferred embodiment of a thermal sensor for determining the magnitude of a signal, such as voltage or power, from an external source. The thermal sensor includes first and second semiconductor means thermally isolated from each other and from ambient thermal energy, each generating an electrical output that is a function of its temperature. The first and second semiconductor means dissipate power as a linear function of respective first and second control signals applied to the first and second semiconductor means. A first thermal element thermally coupled to the first semiconductor means dissipates power as a function of the square of the voltage across the thermal element. The first thermal element is coupled to the external source so that the current through the first semiconductor means varies as a function of the heat coupled to the first semiconductor means by power dissipated in the first thermal element. A differential amplifier generates the first and second control signals as functions of the difference in electrical outputs from the first and second semiconductor means. The power dissipated in the first and second semiconductor means is varied as a linear function of the output from the differential amplifier in an attempt to thermally balance the temperatures of the first and second semiconductor means. The output of the differential amplifier is thus indicative of the power from the external source.

The first and second semiconductor means may include first and second transistors thermally isolated from each other and from ambient thermal energy in which the current through the transistors varies as a function of the temperature of the transistors. The first and second control signals vary the collector-emitter voltages of the first and second transistors, respectively, thereby varying the power dissipated by the first and second transistors as a linear function of the first and second control signals.

A second thermal element may be thermally coupled to the second semiconductor means to dissipate power as a function of the square of the voltage across the second thermal element. The second thermal element may be coupled to the output of a second differential amplifier whose output is derived from the output of the first differential amplifier such that the current through the second semiconductor means also varies as a function of the heat coupled to the second semiconductor means by power dissipated in the second thermal element. The power from the external source is then proportional to the sum of the square of the output of the second differential amplifier and the output of the first differential amplifier. The second thermal element is preferably coupled to the output of the second differential amplifier through a nonlinear control element so that the second thermal element dissipates thermal energy, heating the second semiconductor means with only one polarity of current from the second differential amplifier.

DETAILED DESCRIPTION OF THE INVENTION

The improved thermal sensor of the invention is better understood in comparison to the operation and limitations of conventional RMS converters and power sensors. Accordingly, a brief description of such a conventional converter or sensor is first provided. The conventional thermal sensor 40 illustrated in FIG. 1 includes five resistors 42, 44, 46, 48 and 50; two NPN transistors 52 and 54; a potentiometer 56; a high gain DC differential amplifier or operational amplifier 58; and a diode 60. The resistance of resistor 42 nominally equals the resistance of resistor 44; the resistance of resistor 46 nominally equals the resistance of resistor 48; and transistors 52 and 54 are matched. Resistor 42 and transistor 52, and resistor 44 and transistor 54, are thermally coupled such that transistor 52 is sensitive to the heat produced by current flow through resistor 42, and transistor 54 is sensitive to the heat produced by current flow through resistor 44. The above-described circuit is sometimes also known as an RMS sensor.

Figure 1:
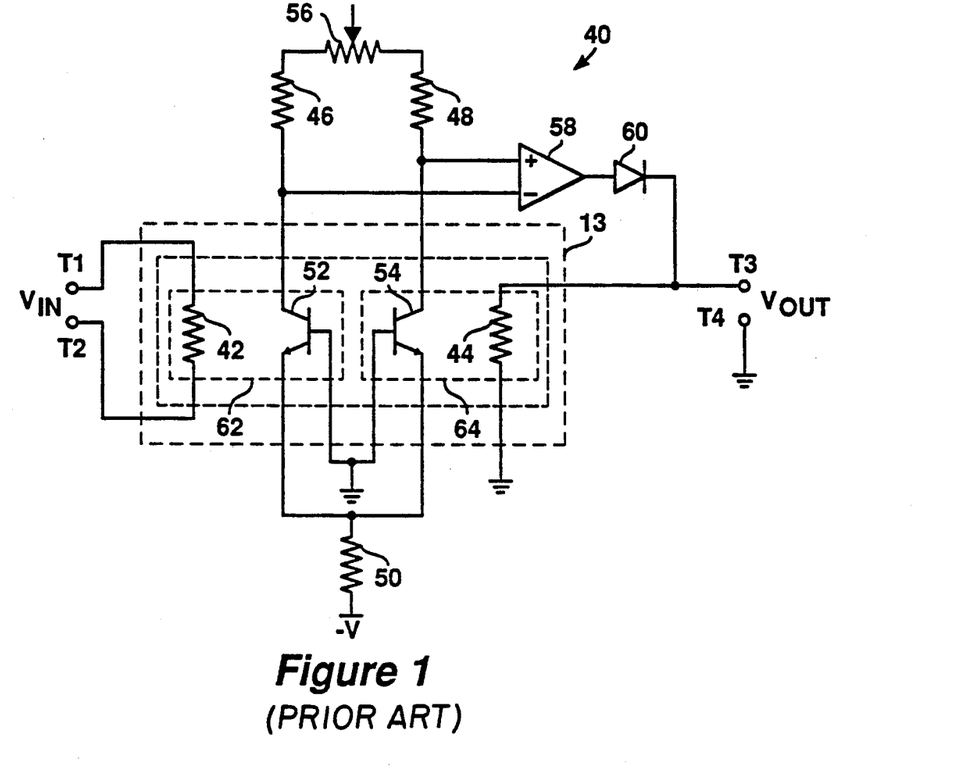
FIG. 1 is a schematic a prior art thermal sensor.

A pair of input terminals T1 and T2 are connected to the opposite ends of resistor 42. The signal to be measured is applied between these terminals T1 and T2. The emitters of transistors 52 and 54 are connected together and through resistor 50 to a negative voltage source $-V$. The transistors 52 and 54 are thus connected as a differential pair, and resistor 50 acts as a constant current sink. The total collector-emitter current flowing through transistors 52 and 54 is thus substantially constant. The bases of transistors 52 and 54 are connected to ground. The collector of transistor 52 is connected to one end of load resistor 46 and to the inverting input of operational amplifier 58. The collector of transistor 54 is connected to one end of load resistor 48 and to the noninverting input of operational amplifier 58. The other ends of load resistors 46 and 48 are each connected to an end of potentiometer 56. The movable element of potentiometer 56 is connected to a positive voltage source $+V$. The output of operational amplifier 58 is connected to the anode of a diode 60. The cathode of the diode 60 is connected to an output terminal T3 and to ground through resistor 44. The output voltage $V_{out}$ is taken across terminal T3 and a ground output terminal T4.

In operation, as the signal to be measured $V_{in}$ is applied across resistor 42, resistor 42 generates heat in accordance with the RMS magnitude of the signal $V_{in}$. The heat produced by the power dissipated in resistor 42 is coupled to transistor 52 since the resistor 42 and transistor 52 are mounted on the same thermally isolated substrate or island 62. Transistor 52, like virtually all transistors, is affected by changes in temperature. As the temperature of transistor 52 increases, its collector emitter current increases, and, since the total current through transistors 52 and 54 is substantially constant, the current through transistor 54 correspondingly decreases. As the current through transistor 52 increases, the voltage drop across resistor 46 increases, thereby causing a reduction in the voltage applied to the inverting input of amplifier 58. Similarly, as the current through transistor 54 decreases, the voltage drop across resistor 48 decreases, thereby causing an increase in the voltage applied to the noninverting input of amplifier 58. This differential voltage applied to operational amplifier 58 causes the amplifier 58 to output a positive voltage which is applied through diode 60 to resistor 44.

A feedback current then flows through resistor 44. The power dissipated in resistor 44 by the feedback current generates heat which is coupled to transistor 54 since resistor 44 and transistor 54 are preferably mounted on the same thermally isolated substrate or island 64. The heat coupled to transistor 54 causes the collector-emitter current of transistor 54 to increase relative to the collector-emitter current through transistor 52 in the same manner that the heat produced by resistor 42 increases the current flowing through transistor 52. The feedback current applied to resistor 44 by operational amplifier 58 thus has a tendency to bring the current flowing through transistors 52 and 54 back into balance. The magnitude of the feedback current required to substantially achieve this current balance is indicative of the power of the signal to be measured $V_{in}$. The feedback current flowing through resistor 44 develops a voltage that is equal to the product of the current and the resistance of resistor 44. This voltage, which is read across the output terminals T3/T4, is equal to the RMS value of the voltage drop across resistor 42, assuming, as mentioned above, that the resistors 42, 44 have the same value. The power dissipated in resistor 44, which is also equal to the power of the signal applied between terminals T1 and T2, is equal to the ratio of the square of the voltage between the output terminals T3 and T4 to the resistance of resistor 44. The diode 60 is provided to prevent positive feedback in the case of a negative $V_{out}$, which would force the feedback loop into a latch-up condition. The movable contact of the potentiometer 56 is used to balance the voltage at the inputs to amplifier 58 with input $V_{in}$ equal to zero.

As mentioned above, the physical embodiment of the thermal sensor 40 preferably utilizes thermally isolated monolithic semiconductor islands 62 and 64 constructed, for example, in the manner described in the aforementioned U.S. Pat. No. 4,257,061, issued to Chapel. Each resistor-transistor pair 42/52 and 44/54 is thermally isolated from ambient thermal energy and from each other to provide sensitivity to the input and feedback signals. The amount of thermal isolation determines the temperature rise of each resistor-transistor pair for a given amount of applied power. The upper limit of applied power (full-scale sensitivity) is determined by the maximum safe, continuous temperature rise that the resistor-transistor structure can absorb without change or damage. Generally, this is approximately a 100° C. temperature rise above ambient. This makes the maximum device temperature 150° C. in a maximum 50° C. ambient environment.

The conventional thermal sensor 10 described in connection with FIG. 1 works well at high levels, such as a temperature rise above ambient between approximately 1° C. and 100° C. However, at low levels, i.e., less than one hundredth of full-scale temperature corresponding to one hundredth of full-scale power, there are several error effects that limit performance and reduce the useful range of the device.

At very low levels, there is an error due to the noise in the sense transistors which is amplified by the necessarily large forward gain of the feedback amplifier 58 and dissipated in the resistor 44. The amplified noise power is an offsetting signal that degrades the linearity of the sensor at low input signal levels and is equivalent to a minimum detectable signal. The noise output by amplifier 58 is applied to resistor 44, thereby causing the resistor 44 to generate a temperature offset. As a result, the resistor 44 and island 64 become slightly warmer than the resistor 42 and island 62 under all conditions. This problem is particularly significant where little or no signal is applied because this noise-generated heat induces an error in the measurement of the input signal. In effect, the sensor is actually measuring the sum of the noise plus the signal and identifying it as the input signal. The measurement of the input signal level is thus in error by the amount of noise.

The problem of correcting or compensating for noise is further complicated by the fact that the diode 60 is used in the feedback loop to prevent the instability which would occur if the feedback voltage to resistor 44 were allowed to go negative. A "perfect" or "ideal" diode would be necessary between amplifier 58 and resistor 44 to allow the feedback to go to exactly zero volts but not go negative. However, the use of this diode adds an additional problem to the feedback loop. At very low signal levels, the amplified sensor noise is rectified by diode 60 and only the portion of the noise current passing through the diode is dissipated in resistor 44. As the level of the input signal is increased, the current through the diode becomes continuous and all of the noise power is applied to resistor 44. Thus the portion of the noise current dissipated in resistor 44 changes as a function of the input signal producing a nonlinear addition of feedback signal and noise. This nonlinear sum of feedback signal and noise is brought into balance with the input signal that is being measured, causing an additional nonlinearity in the response.

If an attempt is made to reduce the noise by reducing the gain of the feedback amplifier 58, another error effect is encountered. To explain this error effect, one must consider the thermal sensor as a servo loop and examine the loop gain. The entire feedback path begins with the base-emitter voltage temperature coefficient, which generates the equivalent of an electrical input to the base of transistor 52 by the temperature rise sensed by that transistor. This equivalent voltage is about $-2$ millivolts per ° C. of temperature change to the transistor. The DC gain of the amplifier formed by the transistors 52 and 54 and their respective load resistors 46 and 48 acts on this temperature-induced signal. The temperature-induced signal is further boosted by the amplifier 58. The heating effect of the resistor 44 raising the temperature of its adjacent transistor 54 base-emitter junction closes the feedback loop.

The thermal feedback is nonlinear with voltage since the power dissipated in the resistor is proportional to the square of the applied voltage. Due to this square law heating effect, the total loop gain is proportional to the magnitude of the feedback voltage. When the feedback voltage is one-tenth of full-scale value, the total loop gain (the product of all the gain terms in the loop) is also at one-tenth of the full-scale value. This reduction in loop gain with decreasing signal level becomes a problem when the thermal error signal between the two transistors 52 and 54 necessary to drive the loop becomes a significant percentage of the thermal input signal level. Thus, this gain error term becomes a higher percentage of the input signal as the input is reduced.

The foregoing problems, which are inherent in the thermal sensor of FIG. 1, are avoided or significantly minimized according to the invention. The invention is based on the concept of generating heat or thermal energy in linear relation to a parameter such as voltage which is a function of the amount of power or voltage to be sensed. As a result, an output is provided that is also linearly related to the sensed power or voltage. It has been discovered that this may be accomplished in a unique fashion by using the sensing transistors themselves as combined sensing devices and thermal energy generating devices. The sensing transistors 52 and 54 dissipate power due to the current $I_c$ that is biased through the transistors and the voltage $V_{ce}$ that appears across the devices. That power is hereafter referred to as bias power. The bias power itself raises the island temperatures when no power is applied to the heater resistors 42 and 44 in FIG. 1.

When the bias power dissipated in one transistor is reduced below that nominal value, this effectively cools the transistor below the normal operating level. Such a capability of cooling one transistor with respect to the other allows the feedback loop to operate through zero feedback level without the need for limiting operation to one polarity. Since the bias power is proportional to the product of $V_{ce}$ times $I_c$, if one term is held constant, the bias power dissipation and the resultant transistor temperature rise can be made linearly proportional to the other term. Under such conditions, the loop gain will be constant and independent of the level of the feedback signal. This allows sufficient loop gain to be employed to make the gain error term insignificant. Since the bias power is now linearly controllable and the feedback voltage can become negative, the noise generated by the subsequent amplifiers has a zero average and is effectively reduced by the feedback within the bandwidth of the feedback loop.

Figure 2:
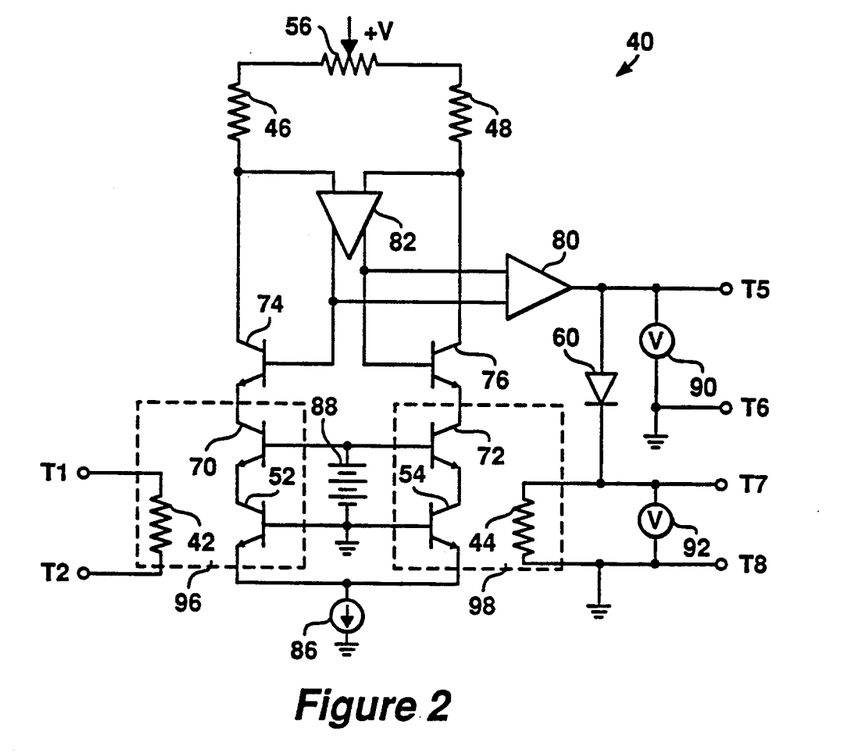
FIG. 2 is a schematic of a preferred embodiment of a thermal sensor constructed according to the invention and used to measure power.

This linear power feedback concept can be implemented in a number of different circuit configurations. The technique according to the preferred embodiment of the invention is illustrated in FIG. 2, a portion of which includes certain components of the basic prior art basic circuit illustrated and described with respect to FIG. 1. For convenience, like reference numerals and characters are used to indicate comparable elements. With reference to FIG. 2, the improved thermal sensor 100 includes a resistor 42 that functions in the same manner as the resistor 42 in the prior art sensor shown in FIG. 1. The thermal sensor 100 also includes three additional resistors 44, 46, 48; six NPN transistors 52, 54, 70, 72, 74 and 76; a potentiometer 56; differential amplifiers 80 and 82; and a diode 60. The resistance of resistor 42 equals the resistance of resistor 44; the resistance of resistor 46 equals the resistance of resistor 48; and the pairs of transistors 52, 54; 70, 72; and 74, 76 are preferably matched to each other.

A pair of input terminals T1, T2 receiving a signal to be measured are connected across the resistor 42. The emitters of transistors 52 and 54 are connected together and to a constant current source 86 to ground. Thus, the sum of the currents flowing through transistors 52, 54 is constant. The bases of transistors 52, 54 are connected to a common ground. Transistors 52, 54 are connected in cascode with transistors 70 and 72. The bases of transistors 70 and 72 are connected to a common bias source, shown as a battery 88. As explained below, transistors 52, 54 function as thermal sense transistors, while transistors 70 and 72 function as heat generating and signal isolating transistors.

Resistor 42 and transistors 52, 70 are mounted on a first thermally isolated island 96, and resistor 44 and transistors 54, 72 are mounted on a second thermally isolated island 98. As a result, resistor 42 and transistors 52, 70 are thermally coupled to each other so that transistor 52 is sensitive to heat produced by current flowing through resistor 42 and transistor 70. Similarly, resistor 44 and transistors 54, 72 are thermally coupled to each other so that transistor 54 is sensitive to heat produced by current flowing through resistor 44 and transistor 72.

External cascode transistors 74, 76 are connected between the collectors of transistors 70, 72 and respective load resistors 46, 48. The voltage difference between the load resistors 46 and 48 is amplified by the differential amplifier 82 and applied to the bases of the external cascode transistors 74 and 76. The difference voltage appearing between the bases of the external cascode transistors 74 and 76 is also fed to differential amplifier 80. The output of amplifier 80 is applied through diode 60 to the resistor 44.

The island 96 receives heat from three sources, namely, resistor 42, sense transistor 52, and heating and isolation transistor 70. The heat generated by the resistor 42 is proportional to the square of the voltage (i.e., power) of the signal applied to terminals T1, T2. The heat applied to the island 96 by the transistor 52 is proportional to its power dissipation. Since the voltage across the transistor 52 is fixed by virtue of its fixed base and collector voltages, the power dissipated in transistor 52 is proportional to the current through the transistor 52. Finally, the heat applied to the island 96 by transistor 70 is also proportional to its power dissipation. The power dissipated by transistor 70 is equal to the product of the current through transistor 70 and its collector-emitter voltage. However, since the voltage on the emitter of transistor 70 is fixed by the bias voltage of the battery 88, the collector to emitter voltage of transistor 70 is controlled by voltage follower transistor 74.

The heat coupled to island 98 also comes from three sources, namely, resistor 44 and transistors 54, 72. The heat coupled to island 98 is proportional to the square of the voltage applied across resistor 44, while the heat coupled to island 98 by the transistors 54, 72 is proportional to their power dissipation. The power is dissipated in transistor 54 in the same manner that power is dissipated in transistor 52, while power is dissipated in transistor 72 in the same manner that power is dissipated in transistor 70. Since the voltage on the emitters of transistors 70 and 72 is substantially fixed, the transistors 70, 72 isolate respective transistors 52, 54 from variations in the voltage on the emitters of transistors 74, 76. The transistors 70, 72 thus perform an isolating function in addition to a heating function.

The heat generated by transistors 52, 70 and 54, 72 is referred to as bias power. The bias power generated by transistors 52, 54 is relatively constant, but the bias power generated by isolating and heating transistors 70, 72 varies as a substantially linear function of the voltages applied to their collectors by transistors 74, 76, respectively.

The bias that transistors 74, 76 apply to respective transistors 70, 72 raises the temperatures of the islands 96, 98 to a steady-state value when no power is applied to the heater resistors 42, 44. When the bias power dissipated in one transistor is reduced below its steady-state value, the circuitry continues to operate as described below. Thus, the circuitry can operate in a linear manner as the power of the signal applied to the terminals T1, T2 approaches and reaches 0.

In operation, if a small amount of power is applied to heating resistor 42 through terminals T1, T2, the power dissipated by the resistor 42 will attempt to raise the temperature of the island 96. The increased temperature of the transistor 52 will then cause the transistor 52 to conduct more current than transistor 54, although the sum of the two currents will remain constant. As more current flows through transistor 52 and less current flows through transistor 54, the voltage applied to amplifier 82 from resistor 46 will decrease and from resistor 48 will increase. The signal that amplifier 82 applies to the base of transistor 74 will then decrease, thereby reducing the voltage across transistor 70. As a result, transistor 70 will dissipate less power to compensate for the power dissipated in resistor 42 and the increase in the power dissipated by transistor 52. At the same time, the voltage that amplifier 82 applies to the base of transistor 76 will increase to increase the voltage across transistor 72. The increased voltage across transistor 72 increases the power dissipated in transistor 72 to compensate for the reduced power dissipated in transistor 54 by virtue of the decrease in current through transistor 76. This negative feedback through amplifier 82 brings the islands 96, 98 back into thermal equilibrium. The differential voltage at the output of amplifier 82 which brings the islands 96, 98 back into thermal equilibrium is boosted by amplifier 80 to provide a power indication to voltmeter 90. It is important to note that the voltage measured by voltmeter 90 is proportional to power dissipated in resistor 42 (i.e., input power) because the reduced power dissipated by transistor 70 and increased power dissipated by transistor 72 are proportional to the differential voltage at the output of amplifier 82. More specifically, the power dissipated in heating resistor 42 is equal to one-half the product of the change in the voltage applied to the collectors of transistors 70, 72 and the constant current generated by the constant current source 88. It is also important to note that the circuitry operates linearly even as the signal applied to the input terminals T1, T2 approaches and reaches 0 in amplitude, thereby making the circuitry relatively insensitive to noise at low signal levels.

The foregoing description of the circuitry of FIG. 2 assumes that the amplitude of the signal applied to the heating resistor 42 is low enough that it does not cause amplifier 82 to generate a signal having sufficient amplitude to forward bias the diode 60. At higher input signal levels, the feedback provided by amplifier 82 can no longer bring the islands 96, 98 into thermal equilibrium. Under these circumstances, the gain of amplifier 80 is selected so that it generates a signal of sufficient amplitude to cause diode 60 to conduct. Amplifier 80 then applies a signal to heating resistor 44 which adds thermal energy to the island 98. The power dissipated by the resistor 44 is proportional to the square of the voltage applied to the resistor. Hence the voltage measured by voltmeter 92 is proportional to the square of the power dissipated by the resistor 44. The feedback loops through amplifiers 82 and 80 automatically maintain the islands 96, 98 in the thermal equilibrium. The movable contact of the potentiometer 56 is used to balance the voltage at the inputs to amplifier 82. By adjusting the movable contact of potentiometer 56, the output voltage of differential amplifier 82 can be balanced to zero with the input signal equal to zero.

When the islands 96, 98 have reached thermal equilibrium, the voltage indicated by voltmeter 92 is equal to the value of the voltage across heating resistor 44. The power dissipated in resistor 44 is equal to the square of the voltage across resistor 44 divided by the value of resistor 44. The total power dissipated in the resistor 42 may then be determined by summing the voltage indicated by voltmeter 90 and square of the voltage indicated by voltmeter 92. The sensor of FIG. 2 may be calibrated by inputting known DC power to resistor 42 and noting the output indications.

While the preferred embodiment illustrated in FIG. 2 uses transistors 70, 72 to dissipate the variable bias power, it should be recognized that the transistors 70, 72 are not absolutely necessary. Instead, the emitters of transistors 74, 76 can be connected directly to the collectors of respective transistors 52, 54. However, eliminating the transistors 70, 72 has the effect of reducing the sensitivity of the sensor and making the incremental change in bias power in transistors 52, 54 not directly equivalent to the input signal power. As with all practical transistors, the transistors 52, 54 have internal resistance between their collectors and their emitters. As a result, when the collector-emitter voltages of the tranșistors are changed (assuming that the cascode transistors 70, 72 are eliminated), internal electrical feedback within the transistors caused by the collector-emitter resistance causes the current through transistors 52, 54 to also change, not entirely due to thermal feedback effects. The result is a change in the response characteristics of the sensor.

The manner in which the sensitivity of the thermal sensor is reduced and response altered by undesirable changes in the current through the transistors 52, 54 can be explained by considering the response of the thermal sensor to an increase in the power of the input signal applied to the thermal sensor. If the power of the input signal applied to the resistor 42 increases, the resulting thermal energy coupled to the transistor 52 causes an increase in the current through the transistor 52. The feedback loop would then reduce the voltage applied to the collector of transistor 52 (assuming that the cascode transistors 70, 72 were eliminated) in an attempt to bring the transistors 52, 54 back into thermal equilibrium. However, because the reduced collector-voltage would also reduce the collector-emitter current, the effective reduction in power of the transistor 42 would be greater than the reduction caused solely by the decrease in collector voltage. This mechanism has the effect of reducing the sensitivity of the thermal sensor. Furthermore, the reduced collector-emitter voltage of transistor 52 should reduce the power dissipated in the transistor 52 linearly with the reduced feedback voltage. However, since the reduced feedback voltage simultaneously reduces the temperature-dependent signal current through transistor 52, less collector voltage change is necessary to bring the collector currents into balance. This change in collector current due to internal electrical feedback within the sense transistors alters the relationship between the applied signal power and the resulting change in the bias power. If the collector-emitter resistance of the transistors 52, 54 is substantially constant with variation in the collector-emitter voltage, the effect of this internal electrical feedback is a change in the constant of proportionality between the input power and the bias power. Thus, while the transistors 70, 72 are not absolutely necessary, they should be used where maximum sensitivity and optimum power response linearity are desired.

The transistors 70, 72 improve the power response and increase the sensitivity of the sensor by effectively raising the collector-emitter (i.e., output) resistance of the transistors 52, 54 by a multiple of the current gains (Beta) of the transistors 70, 72. Since the bases of the transistors 70, 72 are held at a constant voltage by the battery 88, the collector-emitter voltage of the transistors 52, 54 remains fixed. This causes the sense transistors 52 and 54 to operate under constant bias conditions independent of the electrical feedback varying the collector-emitter voltage of the transistors 70, 72. The transistors 70, 72 thus increase linearity of the sensor and make the sensor more sensitive to applied signals.

Figure 3:
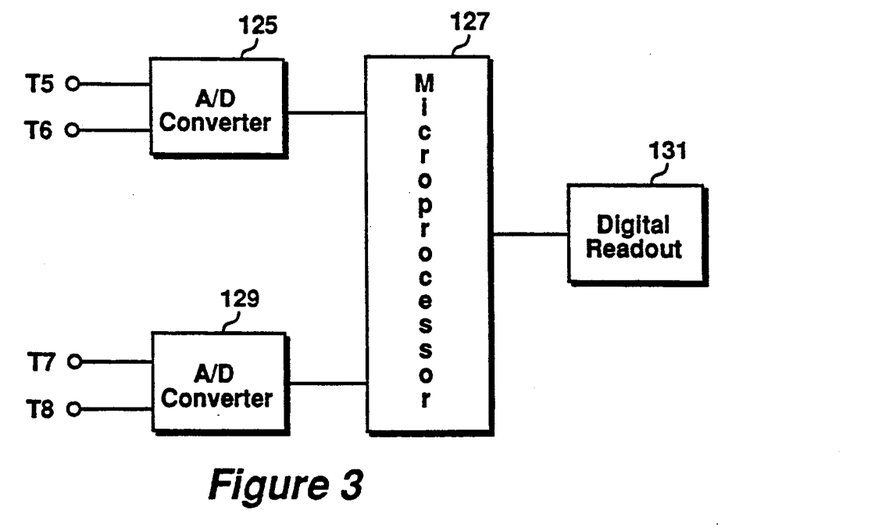
FIG. 3 is a schematic of an automatic readout device for use with the thermal sensor illustrated in FIG. 2.

FIG. 3 shows an automatic means for combining the indications of the meters illustrated at 90 and 92. Thus, the terminals T5 and T6 across the linear power equivalent voltage voltmeter 90 are connected to the input of an analog-to-digital converter 125, which provides a first input to a microprocessor 127. The terminals T7 and T8 across the square law power equivalent voltmeter 92 are connected to the input of an analog-to-digital converter 129, which provides a second digital input to microprocessor 127. The microprocessor in turn computes a sum of powers value or an equivalent effective or RMS voltage value to a suitable digital readout or indicator 131. The readout 131 provides a calibrated indicator of total sensed power or equivalent RMS voltage from the lowest to the highest powers within the dynamic range of the device.

Since the resistor 44 provides square law feedback, the power measurement range is extended at the high level end of the measurement range and the linear power feedback method provides a good performance down to the lowest detectable signal level which is set by the sense transistor noise floor. The arrangement provides good linearity over more than a 50 dB range of power measurement. At very high levels, the feedback is via the resistor 44 and the loop essentially handles the crossover between the two modes. The diode 60 determines the threshold level at which the square law feedback loop begins to act.

While one preferred implementation of this arrangement has been illustrated and described, other implementations are feasible. For example, it would be possible to have the sense transistors 52 and 54 operating as they do in the conventional configuration of FIG. 1 with additional electrically isolated transistors on each island which would dissipate power in a linearly controlled manner and provide thermal feedback to the sense transistors. To obtain linearly controllable power dissipation, the heater transistors could be operated at a constant collector current while their collector-emitter voltages could be varied differentially in a manner similar to the description of the invention. Conversely, their collector-emitter voltages could be held constant while their collector currents were varied differentially, providing the desired linear power relationship. These solutions produce significantly increased complexity due to the increased number of leads that must be brought off each island to add the additional transistors. Maintaining matched device currents or voltages while the opposite parameter is varied is an additional complication as well as increased complexity of the off-chip circuitry in these other implementations make them less preferable than the described embodiment.

Still another variation might involve use of a device such as a Zener diode on the island in addition to the sense transistor because the Zener diode holds its voltage constant as its current is varied. Such devices would permit variation of power as a linear function of one control parameter. However, the additional embodiments mentioned all involve mechanical and/or electrical circuit complexity, which makes them less desirable than the preferred embodiment of the invention illustrated and described in connection with FIG. 2. It should also be noted that the input signal power need not only be dissipated in a resistor placed on the island and directly connected to the input source by means of signal leads. The unknown input signal could be coupled to the sense transistor by any mechanism that causes thermal energy to be dissipated on the island that the sense transistor is on. An example might be electromagnetic energy in the infrared or visible regions of the spectrum impinged onto a suitable absorber located on the island and heating the sense transistor. Another implementation could be the use of a resistive film located on the island and suitably positioned in a microwave waveguide structure such that the guided waves are coupled to the resistive element dissipating energy and heating the sense transistors.

I claim:

1. An apparatus for deriving an output signal that is related to the magnitude of a signal derived from a source, comprising:

first and second matched circuit devices thermally isolated from each other and substantially isolated from ambient thermal energy, said circuit devices each having a variable characteristic controlled by an amount of thermal energy incident thereon;

means for thermally coupling the first circuit device to said source so that thermal energy from said source is incident on the first device;

means responsive to a control signal for applying additional thermal energy differentially to said first and second circuit devices and for raising the thermal energy of said first and second circuit devices to a quiescent value of thermal energy greater than that due to ambient thermal energy;

means for sensing said variable characteristics of said first and second circuit devices;

means responsive to said variable characteristics for generating said control signal to control said means for applying additional thermal energy so that the first and second circuit devices have a tendency to be thermally balanced; and means responsive to said control signal for determining the magnitude of said applied additional thermal energy, said magnitude of said applied additional thermal energy corresponding to the magnitude of the signal from said source.

2. The apparatus of claim 1 wherein said means for applying additional thermal energy comprises a first source of thermal energy coupled to said first circuit device and a second source of thermal energy coupled to said second circuit device, and said means for generating said control signal includes means for generating differential control signals and means for applying said differential control signals respectively to said first and second sources of thermal energy, and further including a third source of thermal energy responsive to said differential control signals for applying further additional thermal energy to said second circuit device.

3. The apparatus of claim 2 wherein said first and second matched circuit devices are mounted respectively on first and second substrates which are substantially thermally isolated from each other and from ambient energy, and further wherein said first source of thermal energy is on said first substrate, and said second and third sources of thermal energy are on said second substrate.

4. The apparatus of claim 1 wherein said first and second matched circuit devices are biased, bipolar semiconductor junction devices.

5. The apparatus of claim 4 wherein said first and second bipolar semiconductor junction devices are bipolar transistors, respectively.

6. The apparatus of claim 1 wherein said output signal is linearly related to the amount of power derived from said source.

7. An apparatus for generating an output signal indicative of the magnitude of an input signal, said apparatus comprising:

first and second matched circuit devices thermally isolated from each other and substantially isolated from ambient energy, each of said circuit devices having a variable characteristic controlled by the amount of thermal energy incident thereon;

means for coupling the first circuit device to said input signal so that thermal energy derived from said input signal is incident on said first circuit device, thereby controlling the variable characteristics of said first circuit device;

means for sensing the variable characteristics of said first and second circuit devices and for generating first and second control signals corresponding thereto;

means linearly responsive to said first and second control signals for applying additional thermal energy differentially to said first and second circuit devices over a first range of said input signal to raise the thermal energy of said first and second circuit devices toward a quiescent, thermally balanced condition that is greater than that due to ambient thermal energy, the magnitude of said additional differential thermal energy being linearly related to the magnitude of said input signal over said first range;

a source of thermal energy responsive to at least one of said first and second control signals in accordance with a predetermined relationship for applying further additional thermal energy to said second circuit device over a second range of said input signal, the magnitude of said further additional thermal energy having said predetermined relationship to the magnitude of said input signal over said second range; and means for generating said output signal as a function of the magnitude of said additional thermal energy and said further additional thermal energy.

8. The apparatus of claim 7 wherein said first and second ranges overlap each other for at least a portion of said first and second ranges of said input signal.

9. The apparatus of claim 7 wherein said first and second matched circuit devices are bipolar transistors, the means for applying additional thermal energy differentially to said first and second circuit devices includes means for adjusting the bias power dissipated in said devices responsive to said control signal, and said source of further additional thermal energy is a resistor.

10. In a voltage and power sensing device including a pair of matched, forward-biased bipolar transistors connected in a differential common emitter configuration, wherein each transistor is associated with one of a pair of matched resistors, heat transfer means thermally coupling each resistor to a respective transistor so that heat generated in the resistors is coupled to their respective transistors to cause temperature variations therein, said transistors exhibiting a collector-emitter current that is a function of the temperature of the transistor, whereby the collector-emitter current through said transistors varies as a result of the power being dissipated by the respective resistor, said transistors being connected to a first amplifier which senses and amplifies a differential voltage resulting from different currents flowing through said transistors and produces an output signal in response thereto, the output signal being connected in a feedback loop to the second of the matched resistors, the first matched resistor being connected to an input terminal for receiving a signal or power source to be sensed, the improvement comprising:

a respective cascode transistor connected in series with each matched transistor, said cascode transistors having their respective bases coupled to differential outputs of a first differential amplifier in an attempt to balance the temperatures of said matched transistors by varying bias power dissipated in said matched transistors as a function of the differential outputs of said first differential amplifier, a voltage drop across said matched transistors varying as a linear function of the power being sensed; and means connected to the output of said first differential amplifier providing an indication of the said power being sensed, said indication bearing a substantially linear relationship to said differential voltage.

11. The apparatus of claim 10, further including a second amplifier means connected to the output of said first differential amplifier, said second amplifier providing a signal of the second of said matched resistors, thereby causing said matched resistor to dissipate further additional power, said signal bearing a substantially square root relationship to said power being sensed.

12. The apparatus of claim 11, including means for combining said indications of power being sensed and providing an indication of power sensed over an effective range of said power sensing device.

13. A voltage and power sensor for determining the voltage or power from an external source, said sensor comprising:

first and second matched sense transistors thermally isolated from each other and substantially isolated from ambient thermal energy, said sense transistors having their bases coupled to each other and to a fixed voltage and their emitters connected to each other and to a current source;

a first thermal element thermally coupled to said first sense transistor, said first thermal element dissipating power, said first thermal element being coupled to said external source so that the current through said first sense transistor varies as a function of the heat coupled to said first transistor by power dissipated in said first thermal element;

a differential amplifier generating a differential output that is proportional to the difference in currents through said first and second sense transistors;

first and second heating transistors thermally coupled to said first and second sense transistors, respectively, said first and second heating transistors having respective emitters connected to collectors of respective sense transistors and respective bases connected to each other and to a higher fixed voltage so that the collector-emitter voltages of said sense transistors remain substantially constant; and first and second cascode transistors having respective bases connected to respective outputs of said differential amplifier and respective emitters connected to collectors of respective heating transistors, said cascode transistors varying the collector-emitter voltages of respective heating transistors causing a change in the power dissipated in the heating transistors which results in a temperature change of the heating transistors as a linear function of the output from said differential amplifier, thereby attempting to thermally balance said sense transistors, whereby the output of said differential amplifier is indicative of the power from said external source.

14. The voltage and power sense of claim 13, further including a second thermal element thermally coupled to said second sense transistor, said second thermal element dissipating power as a function of the square of a voltage across said second thermal element, said second thermal element being coupled to the output of said differential amplifier so that the current through said second sense transistor varies as a function of heat coupled to said second transistor by power dissipated in said second thermal element, whereby the power from said external source is determined as a function of the sum of the square of the output of said differential amplifier and the output of said differential amplifier.

15. The voltage and power sensor of claim 14 wherein said second thermal element is coupled to the output of said differential amplifier through a nonlinear element so that said second thermal element does not couple significant thermal energy to said second sense transistor until the power from said external source exceeds a predetermined value.

16. The voltage and power sensor of claim 13 wherein said first thermal element is a resistor.

17. A voltage and power sensor for determining the power from an external source, said sensor comprising:

first and second semiconductor means thermally isolated from each other and substantially isolated from ambient thermal energy, each of said semiconductor means generating an electrical output that is a function of the temperature of said semiconductor means, said first and second semiconductor means dissipating power as a linear function of respective first and second control signals applied to said first and second semiconductor means, respectively;

a first thermal element thermally coupled to said first semiconductor means, said thermal element dissipating power as a function of the square of a voltage across said thermal element, said first thermal element being coupled to said external source so that the current through said first semiconductor means varies as a function of the heat coupled to said first semiconductor means by power dissipated in said first thermal element; and a differential amplifier generating said first and second control signals as a function of the difference in electrical outputs from said first and second semiconductor means, thereby varying the power dissipated in said first and second semiconductor means as a linear function of the output from said differential amplifier in an attempt to thermally balance the temperatures of said first and second semiconductor means, whereby the output of said differential amplifier is indicative of the power from said external source.

18. The voltage and power sensor of claim 17 wherein said first and second semiconductor means include respective first and second transistors thermally isolated from each other and substantially isolated from ambient thermal energy, the current through said transistors varying as a function of the temperature of said transistors.

19. The voltage and power sensor of claim 17 wherein said first and second semiconductor means include respective first and second transistors, and wherein said first and second control signals vary the collector-emitter voltages of said first and second transistors, respectively, thereby varying the power dissipated by said first and second transistors as a linear function of said first and second control signals.

20. The voltage and power sensor of claim 17 wherein said first and second semiconductor means include respective first and second sense transistors thermally isolated from each other and substantially isolated from ambient thermal energy, the current through said sense transistors varying as a function of the temperature of said sense transistors, said first sense transistor being thermally coupled to said first thermal element, said first and second semiconductor means further including respective first and second heating transistors connected in series with, and thermally coupled to, respective first and second sense transistors, said first and second control signals varying respective collector-emitter voltages of said first and second heating transistors, respectively, thereby varying the power dissipated in said first and second heating transistors as a linear function of said first and second control signals.

21. The voltage and power sensor of claim 17, further including a second thermal element thermally coupled to said second semiconductor means, said second thermal element dissipating power as a function of the square of a voltage across said second thermal element, said second thermal element being coupled to the output of said differential amplifier so that the current through said second semiconductor means varies as a function of the heat coupled to said semiconductor means by power dissipated in said second thermal element, whereby the power from said external source is a function of the sum of the square of the output of said differential amplifier and the output of said differential amplifier.

22. The voltage and power sensor of claim 21 wherein said second thermal element is coupled to the output of said differential amplifier through a nonlinear element so that said second thermal element does not couple significant thermal energy to said second semiconductor means until the power from said external source exceeds a predetermined value.

23. The voltage and power sensor of claim 17 wherein said first thermal element is a resistor.

* * * * *

UNITED STATES PATENT AND TRADEMARK OFFICE
CERTIFICATE OF CORRECTION

PATENT NO. : 5,291,073
DATED : March 1, 1994
INVENTOR(S) : Robert J. Lewandowski It is certified that error appears in the above-indentified patent and that said Letters Patent is hereby corrected as shown below:

In column 14, claim 14, line 11, please delete "sense" and substitute therefor --sensor--.

Signed and Sealed this

Second Day of August, 1994

Attest:

BRUCE LEHMAN

Attesting Officer

Commissioner of Patents and Trademarks